United States Patent
Windhorn

(10) Patent No.: US 7,212,078 B2
(45) Date of Patent: May 1, 2007

(54) METHOD AND ASSEMBLY FOR PROVIDING IMPEDANCE MATCHING NETWORK AND NETWORK ASSEMBLY

(75) Inventor: Thomas H Windhorn, Beverly, MA (US)

(73) Assignee: Tokyo Electron Limited, Tokyo (JP)

( * ) Notice: Subject to any disclaimer, the term of this patent is extended or adjusted under 35 U.S.C. 154(b) by 209 days.

(21) Appl. No.: 10/779,876

(22) Filed: Feb. 18, 2004

(65) Prior Publication Data

US 2004/0163594 A1    Aug. 26, 2004

Related U.S. Application Data

(60) Provisional application No. 60/449,543, filed on Feb. 25, 2003.

(51) Int. Cl.
*H03H 7/38* (2006.01)
*H01F 21/06* (2006.01)

(52) U.S. Cl. ............. 333/32; 333/17.3; 333/263; 333/99 PL; 334/72; 336/132

(58) Field of Classification Search ......... 333/17.3, 333/32–33, 263, 99 PL; 334/70–72, 74, 334/85; 336/130–132
See application file for complete search history.

(56) References Cited

U.S. PATENT DOCUMENTS

| | | | | |
|---|---|---|---|---|
| 1,911,980 A | * | 5/1933 | Vance | 336/138 |
| 3,764,940 A | * | 10/1973 | Vergnolle | 333/124 |
| 4,362,632 A | * | 12/1982 | Jacob | 422/186.04 |
| 4,441,092 A | * | 4/1984 | Thornton et al. | 336/130 |
| 4,673,589 A | * | 6/1987 | Standley | 427/577 |
| 5,309,063 A | * | 5/1994 | Singh | 315/111.51 |
| 5,315,611 A | * | 5/1994 | Ball et al. | 372/56 |
| 5,392,018 A | * | 2/1995 | Collins et al. | 336/155 |
| 5,473,291 A | * | 12/1995 | Brounley | 333/17.3 |
| 5,537,004 A | * | 7/1996 | Imahashi et al. | 315/111.21 |
| 5,656,123 A | * | 8/1997 | Salimian et al. | 156/345.43 |
| 5,767,628 A | * | 6/1998 | Keller et al. | 315/111.51 |
| 5,842,154 A | * | 11/1998 | Harnett | 702/106 |
| 5,889,252 A | * | 3/1999 | Williams et al. | 219/121.54 |
| 6,020,686 A | * | 2/2000 | Ye et al. | 315/111.51 |
| 6,028,394 A | | 2/2000 | Keller et al. | |
| 6,095,084 A | * | 8/2000 | Shamouilian et al. | 118/723 E |

(Continued)

FOREIGN PATENT DOCUMENTS

EP        0 878 826 A2    11/1998

(Continued)

*Primary Examiner*—Robert Pascal
*Assistant Examiner*—Kimberly E Glenn
(74) *Attorney, Agent, or Firm*—Pillsbury Winthrop Shaw Pittman LLP

(57) ABSTRACT

An impedance matching network and network assembly employ one or more variable inductive elements, wherein one or more of the variable inductive elements includes a high temperature ferrite core, a helical coil, and a means for physically translating the magnetic core through the helical coil. An impedance matching network may alternatively or additionally employ one or more variable inductive elements, wherein one or more of the variable inductive elements is cooled using a fan assembly. Further, the impedance matching network and network assembly may alternatively or additionally employ one or more variable inductive elements, wherein the cooling of one or more of the variable inductive elements is facilitated by increasing the surface area of the variable inductive element core.

71 Claims, 19 Drawing Sheets

U.S. PATENT DOCUMENTS

| | | | |
|---|---|---|---|
| 6,155,199 A * | 12/2000 | Chen et al. .............. 118/723 I |
| 6,178,920 B1 | 1/2001 | Ye et al. |
| 6,252,354 B1 | 6/2001 | Collins et al. |
| 6,424,232 B1 | 7/2002 | Mavretic et al. |
| 6,437,653 B1 | 8/2002 | Cruz et al. |
| 6,462,482 B1 * | 10/2002 | Wickramanayaka et al. ..... 315/111.21 |
| 6,462,628 B2 * | 10/2002 | Kondo et al. .............. 333/24.2 |
| 6,579,426 B1 * | 6/2003 | van Gogh et al. ...... 204/192.25 |
| 6,695,954 B2 * | 2/2004 | Hong .................... 204/192.12 |
| 2002/0038631 A1 | 4/2002 | Sumiya et al. |

FOREIGN PATENT DOCUMENTS

| | | |
|---|---|---|
| GB | 1 572 833 | 8/1980 |
| JP | 03-019305 | 1/1991 |
| JP | 2002-231540 | 8/2002 |

* cited by examiner

METHOD AND ASSEMBLY FOR PROVIDING IMPEDANCE MATCHING NETWORK AND NETWORK ASSEMBLY

This non-provisional application claims the benefit of U.S. Provisional Application No. 60/449,543, filed Feb. 25, 2003, the contents of which are incorporated in their entirety herein by reference.

BACKGROUND OF THE INVENTION

1. Field of the Invention

The present invention relates to impedance matching; more particularly, the present invention relates to impedance matching networks and network assemblies, and impedance matching techniques.

2. Description of Related Art

In many materials processing applications and in the manufacturing and processing of semiconductors, Integrated Circuits (IC), displays and other electrical devices, a plasma reacts, or facilitates a reaction, with a substrate, such as a semiconductor wafer. For example, in order to fabricate ICs, modem semiconductor processing systems may utilize plasma assisted techniques such as Reactive Ion Etching (RIE), Plasma Enhanced Chemical Vapor Deposition (PECVD), sputtering, reactive sputtering, and ion-assisted Plasma Vapor Deposition (PVD). Thus, in such known systems, a processing plasma is often employed to assist both etch and deposition processes. The processing plasma can, for example, be formed by coupling Radio Frequency (RF) power to the processing plasma, either capacitively through electrodes or inductively through a coil. In both cases, impedance matching networks are used to improve the transfer of RF power to the processing plasma.

SUMMARY OF THE INVENTION

In accordance with at least one embodiment of the invention, an impedance matching network and network assembly employ one or more variable inductive elements, wherein one or more of the variable inductive elements includes a high temperature ferrite core, a helical coil, and a means for physically translating the magnetic core through the helical coil.

In accordance with at least another embodiment of the invention, an impedance matching network employing one or more variable inductive elements, wherein one or more of the variable inductive elements is cooled using a fan assembly.

In accordance with at least another embodiment of the invention, an impedance matching network employing one or more variable inductive elements, wherein the cooling of one or more of the variable inductive elements is facilitated by increasing the surface area of the variable inductive element core.

BRIEF DESCRIPTION OF THE DRAWINGS

Various embodiments of this invention will be described in detail, with reference to the following figures, wherein.

DETAILED DESCRIPTION OF EMBODIMENTS OF THE INVENTION

Figure 1:
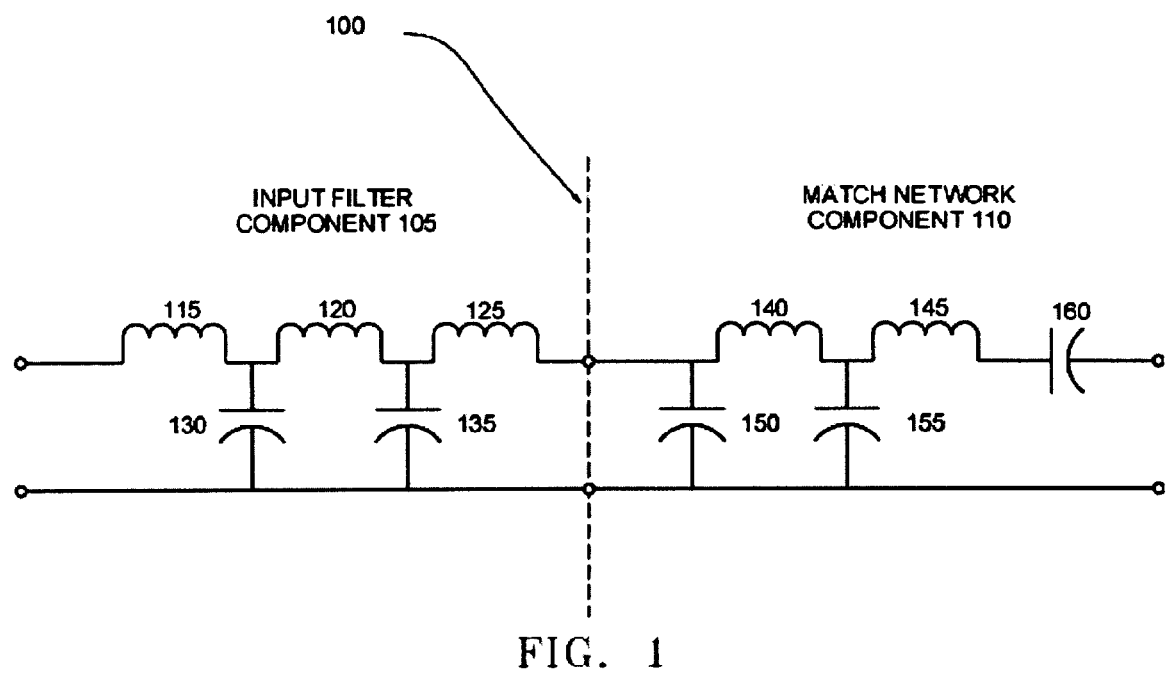
FIG. 1 includes an electrical schematic for a matching network employing high temperature ferrites in variable inductive elements in accordance with at least one embodiment of the invention.

In accordance with at least one embodiment of the present invention, variable inductive elements are utilized in a matching network. For example, FIG. 1 provides an exemplary electrical schematic associated with one implementation of a matching network designed in accordance with at least one embodiment of the invention. As illustrated in FIG. 1, the matching network 100 is comprised of an input filter component 105 and a match network component 110. It should be understood that a matching network designed in accordance with various embodiments of the invention may be configured to deliver a maximum radio frequency power of, for example, 500, 1500, 2500, 3500, 4500, or 5000 watts.

Within the input filter component 105, three inductive elements 115, 120, 125 and two capacitive elements 130, 135 are coupled together to provide input filtering functionality. The number and size of inductive and capacitive elements along with the addition of other electrical elements may be determined based on the particular circuitry coupled to the matching network 100. However, as an example, the inductive element 115 may be 300 nano-Henries (nH). Similarly, the inductive element 120 may be, for example, 500 nH, and the inductive element 125 may be, for example, 250 nH. The capacitive element 130 may be 200 pico-Farrads (pF), and the capacitive element 135 may be, for example, 200 pF.

Within the match network component 110, two inductive elements 140, 145 and three capacitive elements 150, 155 and 160 are coupled together to provide both the real and imaginary component of impedance matching functionality. The number and size of inductive and capacitive elements along with the addition of other electrical elements may be determined based on the particular circuitry coupled to the matching network 100, e.g., the load impedance being matched. However, as an example, the inductive elements 140, 145 may be variable inductive elements with a range of 6–30 micro-Henries (μH). The capacitive elements 150, 155 may be 1000 pico-Farrads (pF), and the capacitive element 160 may be, for example, 0.02 micro-Farrads (μF). By providing the variable inductive element ranges, the matching network component can be tuned to the load impedance of the system being matched.

Figure 2:
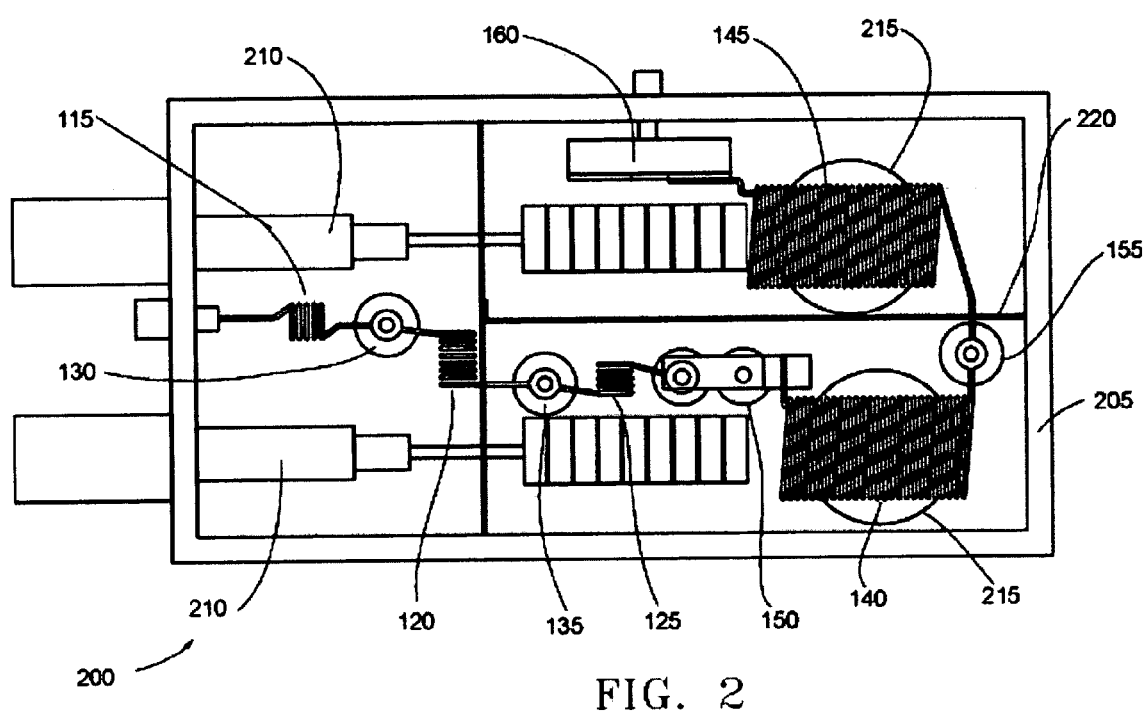
FIG. 2 includes an illustration of an implementation of at least one embodiment of the invention.

The exemplary electrical schematic illustrated in FIG. 1 corresponds to the working design of a matching network assembly 200 shown in plan view in FIG. 2. As shown in the FIG. 2, delineation between the electrical components of the input filter component 105 and the match network component 110 are not based on their location in a particular physical compartment of a housing 205 that houses the matching network 100. However, there may be some correspondence between the electrical components and the physical compartments of the housing 205.

As illustrated in FIG. 2, the inductive element 115 is coupled to both the inductive element 120 and the capacitive element 130. The inductive element 120, in turn, is coupled to the capacitive element 135 (located in the lower compartment on the left hand side of the housing 205). The capacitive element 135 is coupled to the inductive element 125, which is coupled to the capacitive element 150. This capacitive element 150 is implemented, in FIG. 2, using two capacitive elements; however, this is not a requirement. The capacitive element 150 is coupled to the variable inductive element 140, which is also coupled to the capacitive element 155. The capacitive element 155 is coupled to the variable inductive element 145, which is coupled to the capacitive element 160.

In accordance with a particular implementation of this embodiment, in the variable inductive elements 140 and 145 used in the matching network component, the ferrite core of the inductive elements are made movable, and the RF current-carrying coils are stationary. The linear actuators 210, which are implemented in FIG. 2 as individual motors, act to moving the core in and out of the helical coil to change the inductive elements' inductances to provide variable inductive element functionality. Thus, only the magnetic cores are movable and actuated either manually or via a motor (under control of an operator or an automatic match network controller); the remaining parts of the RF structure, in particular all current-carrying components, are stationary. Having the main RF current-carrying conductor path (e.g., the coil) stationary reduces the number of possible points of failure in RF circuits.

Because power loss of current ferrite materials increases dramatically with RF frequency, ferrite materials in high-power RF circuits of high frequencies, for example, higher than ten MHz, are not currently used. This situation may change as additional ferrite materials become available. The use of ferrite materials in RF circuits is well-suited for matching networks for various circuits including, for example, plasma processing tool electrostatic chuck RF-drive circuits, and low-frequency plasma-excitation RF drive circuits.

The magnetic core of the variable inductive elements 140 and 145 may be comprised of materials that provide the requisite inductance range over a particular frequency range and temperature range. For example, the magnetic core may be formed using a high temperature ferrite material such as, for example, NiZn ferrite—Type 61 (commercially available from Fair-rite Products Corporation in Wallkill, N.Y.). A high temperature ferrite material is a material having a Curie temperature higher than about 150° C. Alternatively, a high temperature ferrite material is a material having a Curie temperature higher than about 200° C., or higher than about 250° C., or higher than about 300° C., or higher than about 350° C., or higher than about 400° C.

FIGS. 3–7 illustrate various plasma processing system embodiments that utilize a chuck RF drive match network that has at least one variable inductor in accordance with the invention. The match network may further have any number of fixed inductors, and variable or fixed capacitors. Shown in all figures are the match network, match network controller, RF power source, and chuck RF drive transmission line. In these figures, it should be understood that the RF filter may be part of the match network, if it is used at all.

Figure 3:
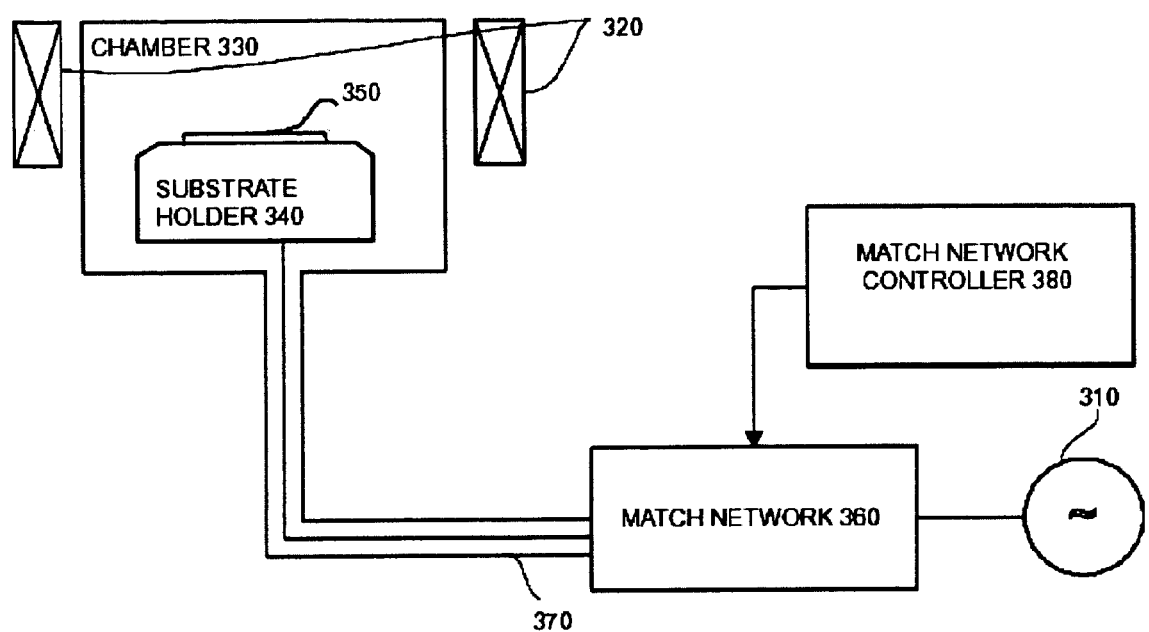
FIGS. 3–7 illustrate various plasma processing system embodiments that utilize a chuck RF drive match network that has at least one variable inductor.

FIG. 3 is a plasma processing system including a magnetically enhanced capacitive-coupled plasma reactor utilizing a match network and match network controller in accordance with at least one embodiment of the invention. The chuck in the system may be driven, for example, by two RF power supplies, one high frequency for plasma generation (not shown), and another, illustrated as 310, low frequency for chuck bias generation. The system also includes a set of magnets 320 for enhancing the capacitive-coupled plasma reactor. A chamber 330 includes a substrate holder 340 for holding a substrate 350. The match network 360 is coupled to the chamber 330 and substrate holder 340 via an RF transmission line 370; the match network 360 is also coupled to the match network controller 380 that controls operation of the match network 360. The match network 360 or the match network for the high frequency power supply may include one or more variable inductors and may or may not include an RF filter.

Figure 4:
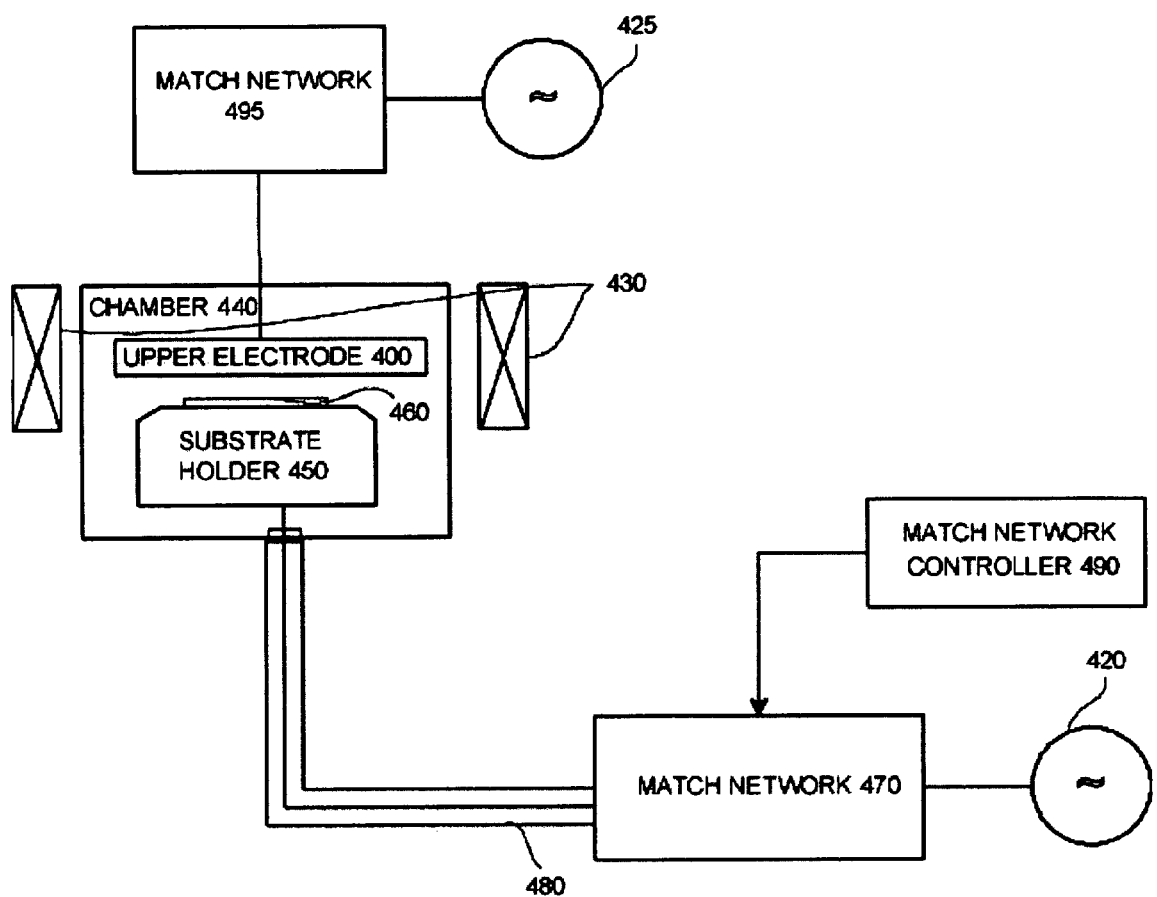

FIG. 4 illustrates a two-frequency capacitive coupled plasma reactor, with high frequency applied to an upper electrode 400 for plasma generation, and chuck RF bias applied to the chuck via RF power source 420. The system utilizes a match network and match network controller in accordance with at least one embodiment of the invention. Again, as in FIG. 3, the system also includes a set of magnets 430 for enhancing the capacitive-coupled plasma reactor, the chamber 440 of which including the upper electrode 400 and a substrate holder 450 for holding a substrate 460. The upper electrode 400 is coupled to an RF power source 425 via a match network 495. A match network 470 is coupled to the chamber 440 and substrate holder 450 via an RF transmission line 480; the match network 470 is also coupled to the match network controller 490 that controls operation of the match network 470. The match network 470 or 495 may include one or more variable inductors and may or may not include an RF filter. In this plasma processing system, only chuck bias RF power is applied to the chuck and RF power for plasma generation is applied to the upper electrode.

Figure 5:
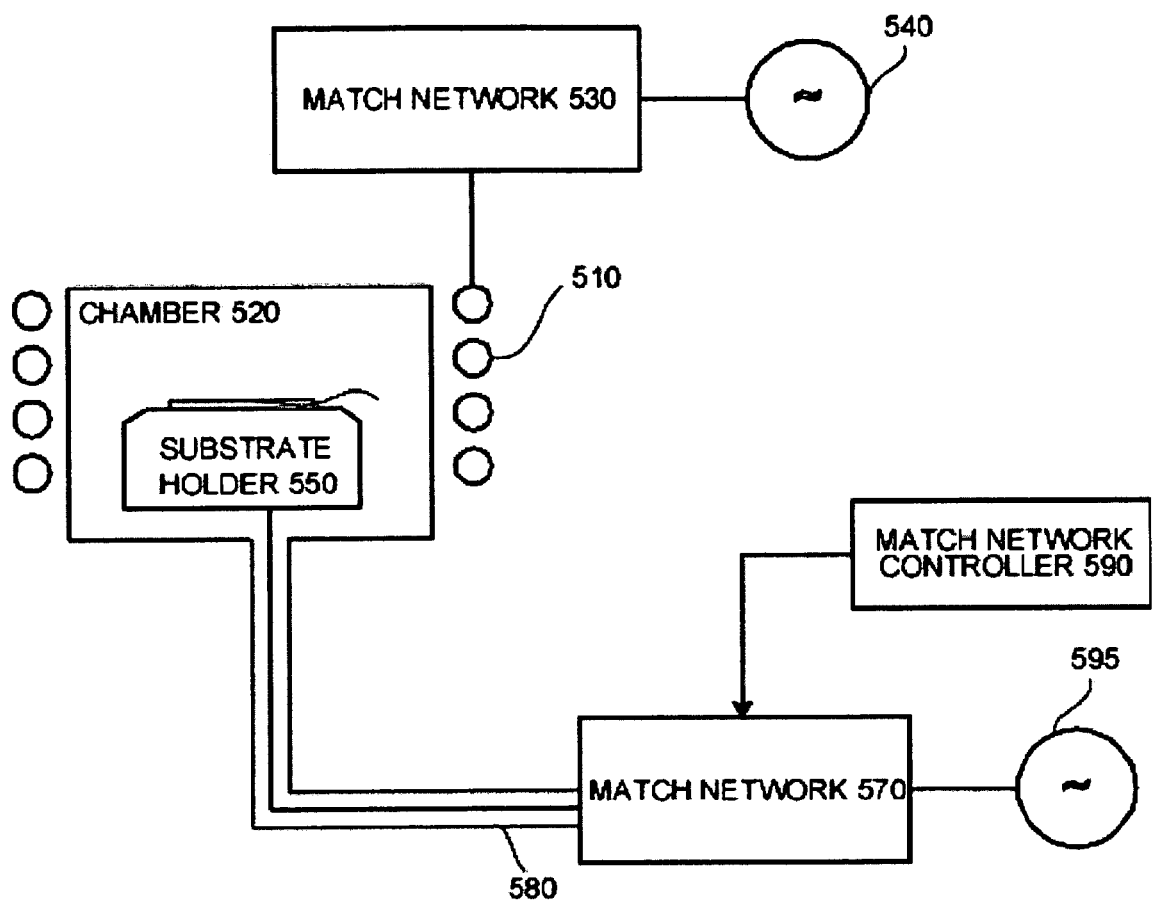

FIG. 5 illustrates an example of a system utilizing an Inductive Coupled Plasma (ICP) source and a match network and match network controller in accordance with at least one embodiment of the invention. The system also includes an ICP coil 510 located around the chamber 520 and coupled to a match network 530 that is coupled to an associated RF power source 540. The chamber 520 includes a substrate holder 550 for holding a substrate 560. The chamber 520 and substrate holder 550 are coupled to a match network 570 via an RF transmission line 580; the match network 570 is also coupled to the match network controller 590 that controls operation of the match network 570. The match network 570 is also coupled to the bias RF power source 595. The match network 570 or 530 may include one or more variable inductors and may or may not include an RF filter. In this plasma processing system, only chuck bias RF power is applied to the chuck and RF power for plasma generation is applied elsewhere.

Figure 6:
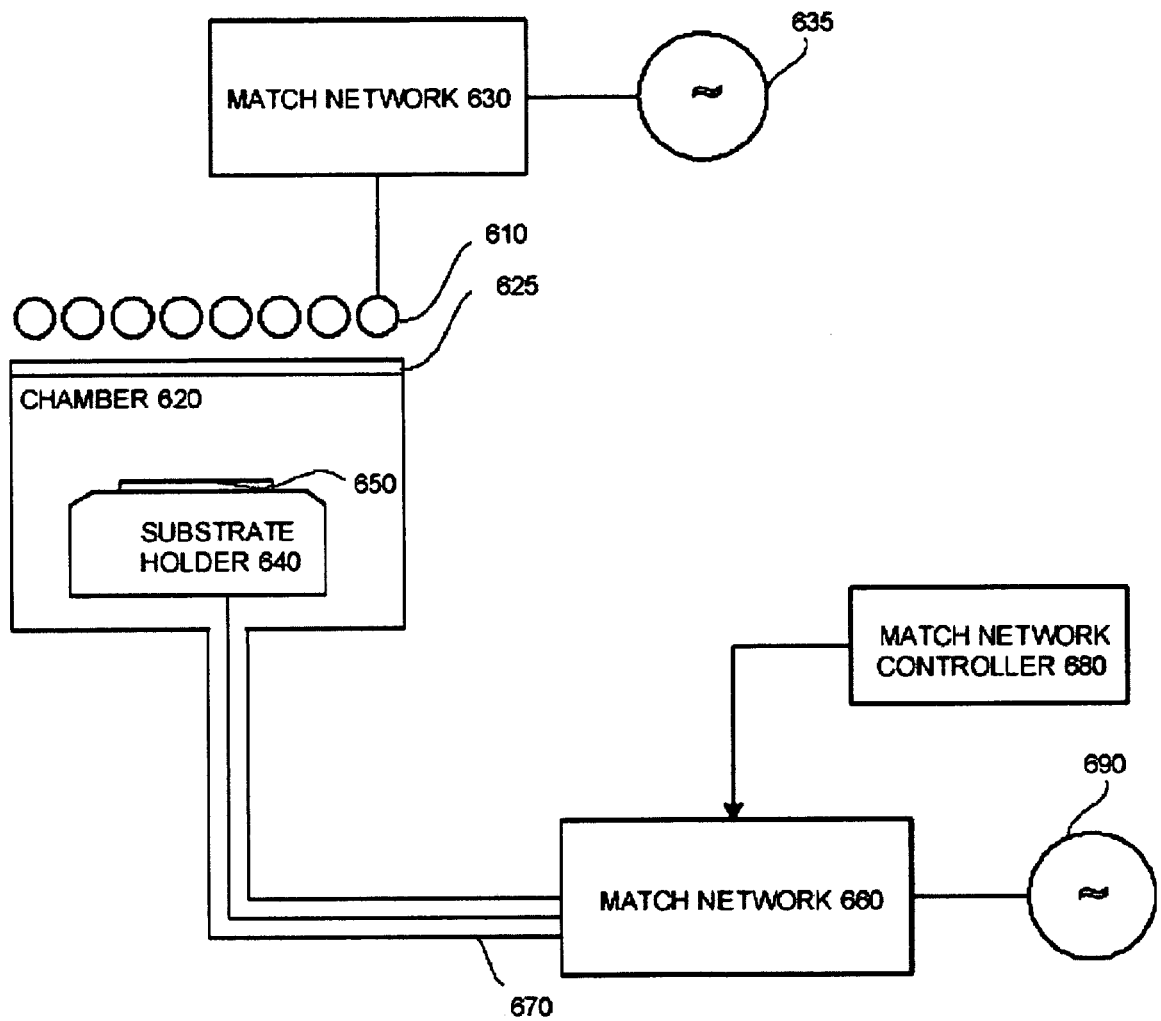

FIG. 6 illustrates utilizing a Transformer Coupled Plasma (TCP) source and a match network and match network controller in accordance with at least one embodiment of the invention. The system includes a TCP coil 610 located above the chamber 620 including a TCP window 625. The TCP coil 610 is coupled to a match network 630 that is coupled to an associated RF power source 635. The chamber 620 includes a substrate holder 640 for holding a substrate 650. The chamber 620 and substrate holder 640 are coupled to a match network 660 via an RF transmission line 670; the match network 660 is also coupled to the match network controller 680 that controls operation of the match network 660. The match network 660 is also coupled to the bias RF power source 690. The match network 660 or 630 may include one or more variable inductors and may or may not include an RF filter. In this plasma processing system, only chuck bias RF power is applied to the chuck and RF power for plasma generation is applied elsewhere.

It should be appreciated that, although FIGS. 4–6 do not illustrate a match network controller in association with the match networks 495, 530 and 630, each of these match networks may be implemented in association with a match network controller.

Figure 7:
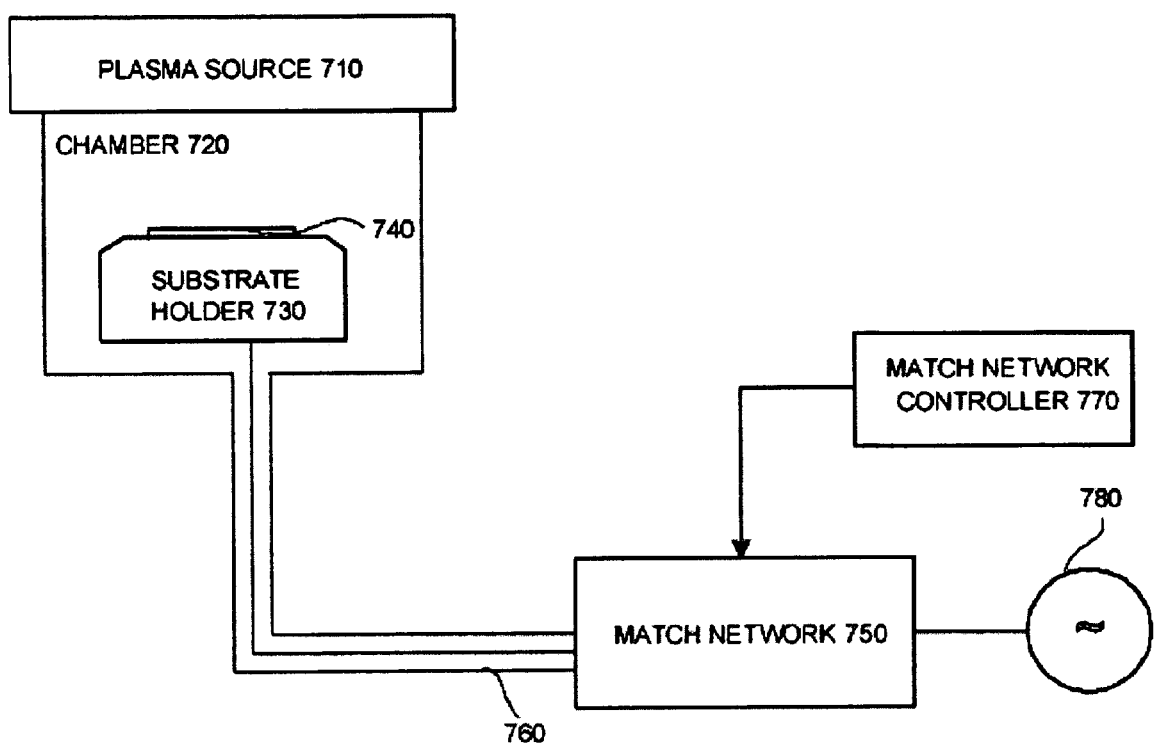

FIG. 7 generally illustrates a plasma system utilizing a plasma source, such as Helicon, ECR (electron cyclotron resonance), etc. and a match network and match network controller in accordance with at least one embodiment of the invention. The system includes a plasma source 710, a chamber 720 including a substrate holder 730 for holding a substrate 740. The chamber 720 and substrate holder 730 are coupled to a match network 750 via an RF transmission line 760; the match network 750 is also coupled to a match network controller 770 that controls operation of the match network 750. The match network 750 is also coupled to the bias RF power source 780. The match network 750 may include one or more variable inductors and may or may not include an RF filter. In this plasma processing system, only chuck bias RF power is applied to the chuck and RF power for plasma generation is applied elsewhere.

It should be appreciated that, although not illustrated in FIGS. 3 through 7, each of these processing systems may be implemented in association with both the match networks and/or match network controllers in such a way that variable inductive elements and match networks are an integral part of a radio frequency power source used by the plasma processing system.

Figure 8A:
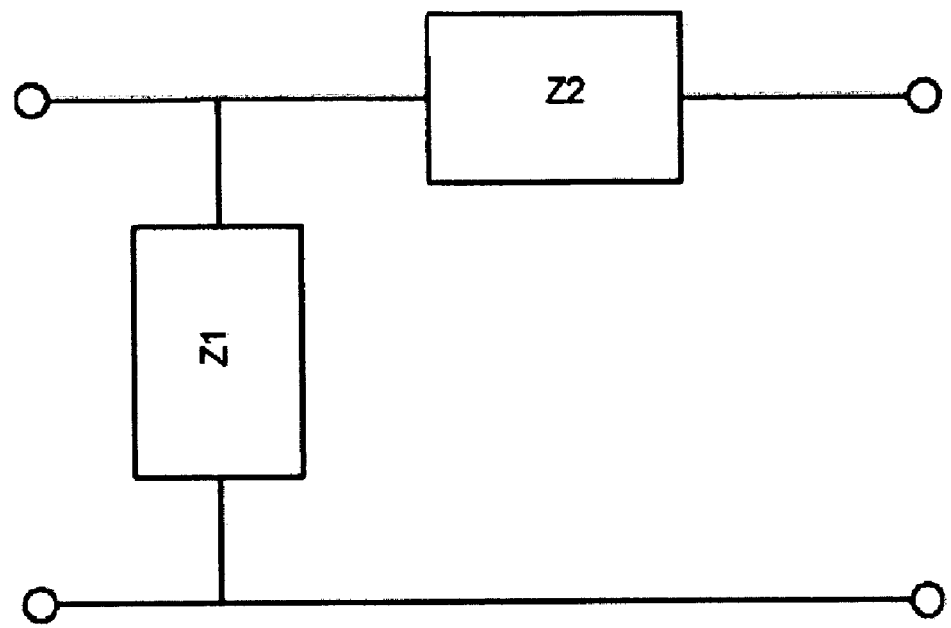
FIGS. 8A–8C illustrate various possible circuit topologies in accordance with at least one embodiment of the invention.
Figure 8B:
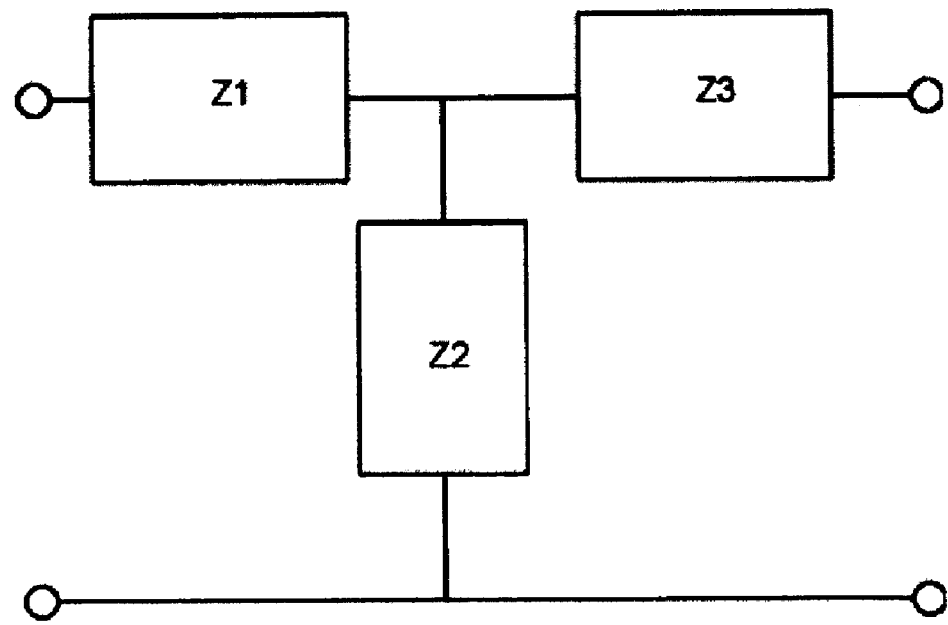
Figure 8C:
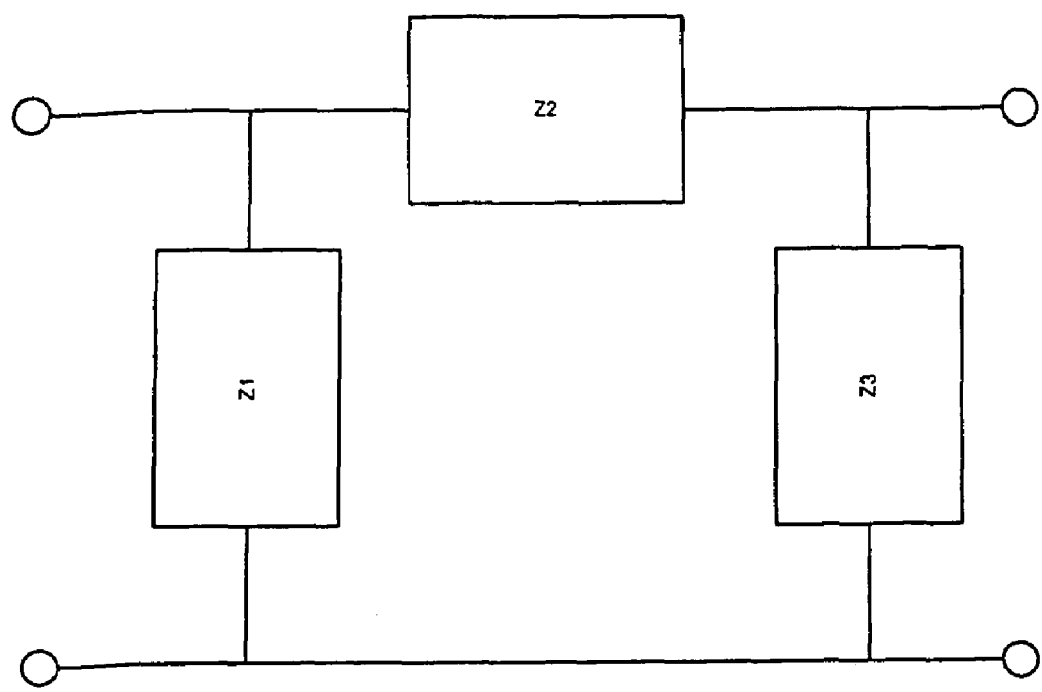

Regardless of the type of system that the match network is configured with, the match network may be implemented using a variety of topologies, such as L, T, Π, etc. and combinations thereof. The network shown in FIG. 1 illustrates a 5-component RF filter (left part) coupled to a match network with 4 reactive components (the fourth component consists of a series impedance of inductor 145 and capacitor 160). However, other possible topologies are illustrated in FIGS. 8A–8C, wherein each reactive component indicated by a box of impedance $Z_i$, can be comprised of multiple reactive components in series.

Figure 9:
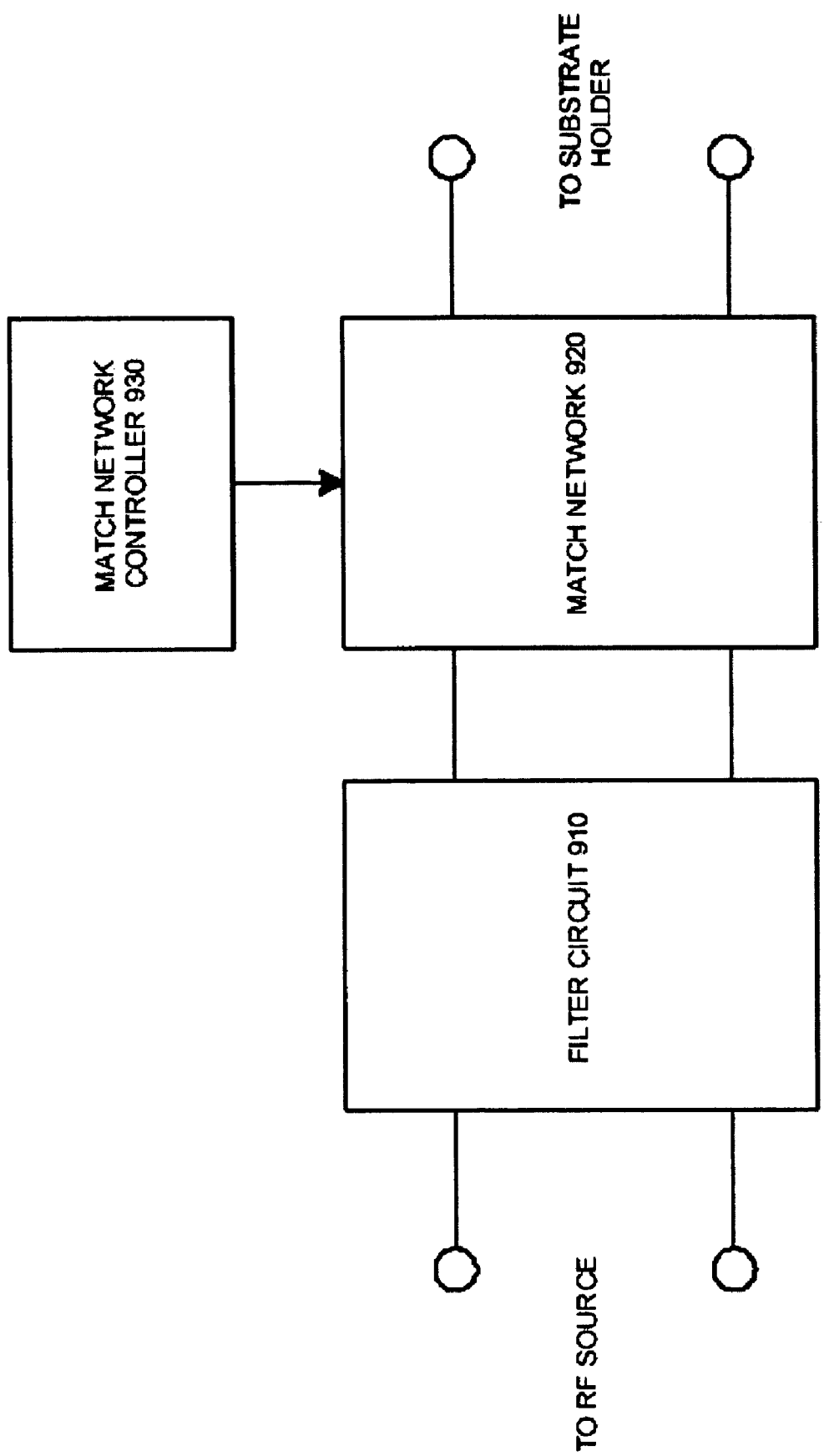
FIG. 9 illustrates a first example of a possible RF filter location with respect to a match network.
Figure 10:
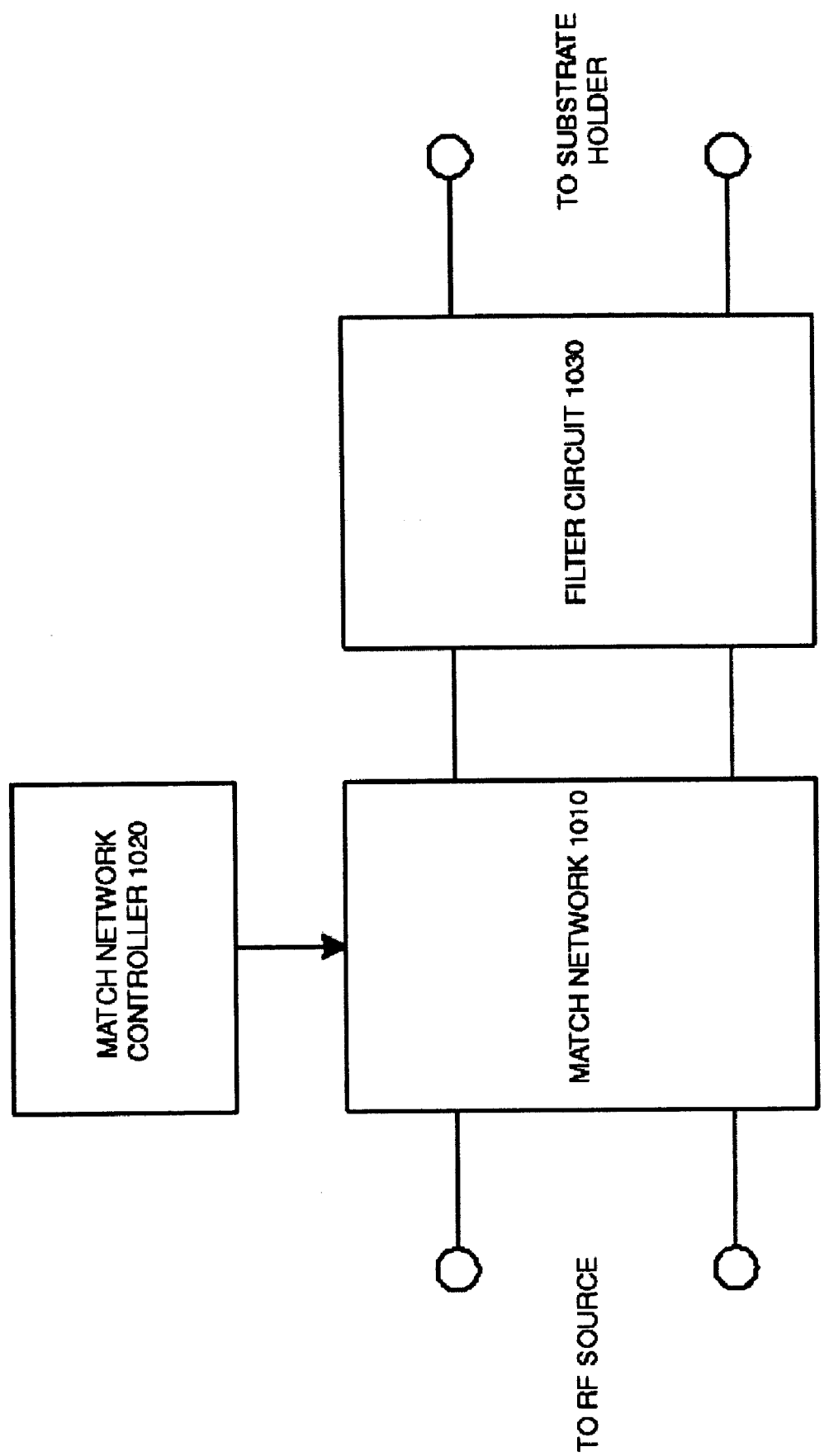
FIG. 10 illustrates a second example of a possible RF filter location with respect to a match network.
Figure 11:
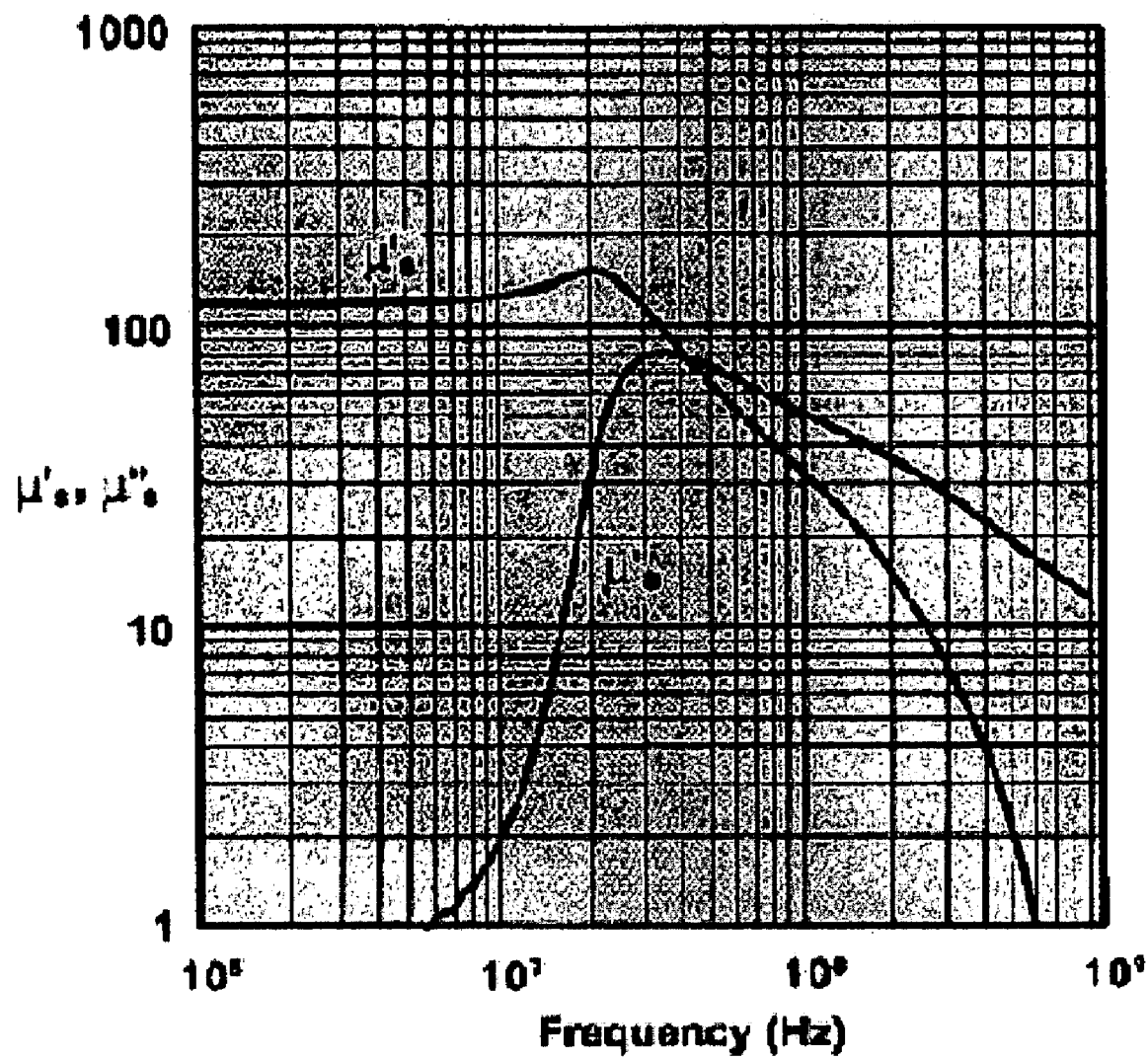
FIG. 11 illustrates the relationship between the complex permeability and frequency for the NiZn ferrite—Type 61 ferromagnetic material.
Figure 12:
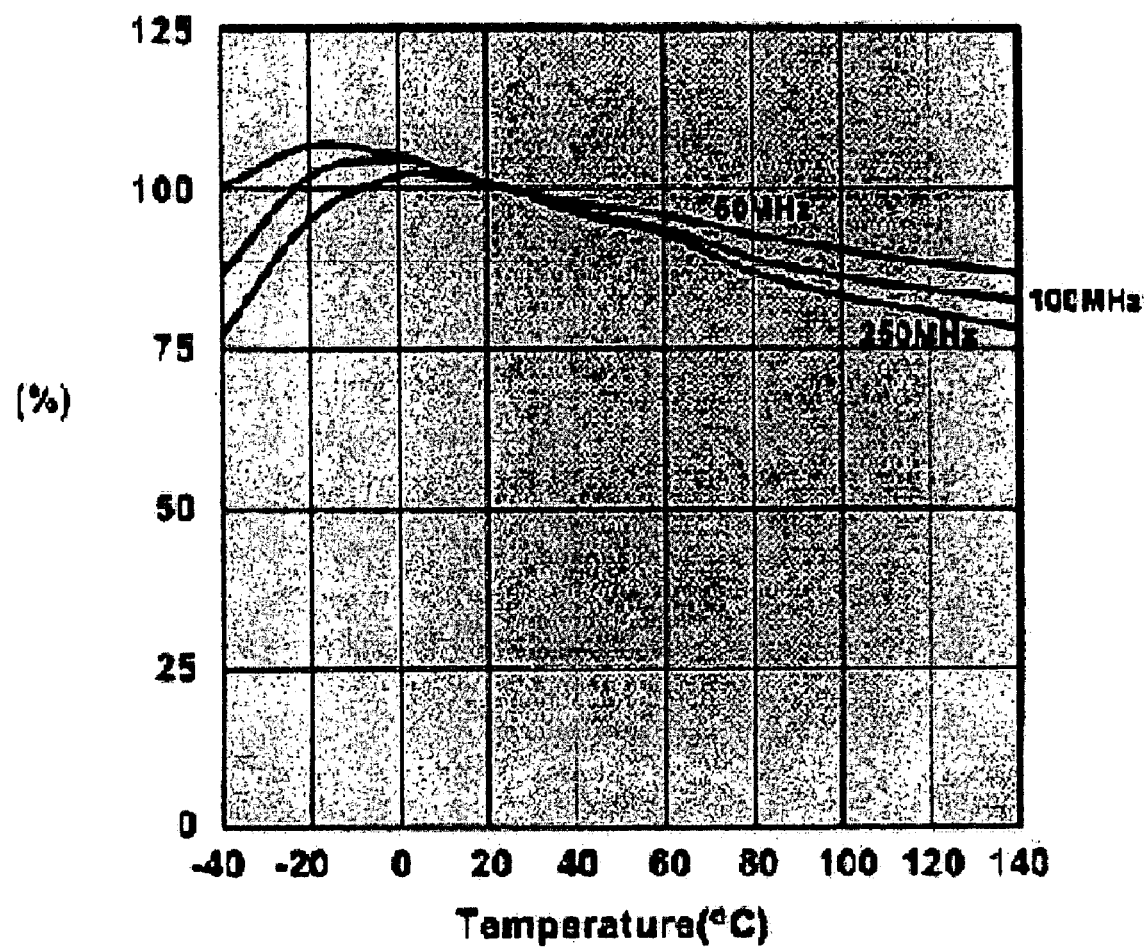
FIG. 12 illustrates the relationship between the original impedance and temperature for the NiZn ferrite—Type 61 ferromagnetic material.

It should be understood that the RF filter of FIG. 1. may be inserted either before or after the match network, as illustrated in FIGS. 9 and 10. For example, as illustrated in FIG. 9, the filter circuit 910 may be inserted before the match network 920 coupled to the match network controller 930. Alternatively, as illustrated in FIG. 10, the match network 1010 may be coupled to the match network controller 1020 and inserted before the filter circuit 1030. In essence, it should be understood that any suitable RF filter topology may be used, which are well known to those skilled in the art.

Figure 13:
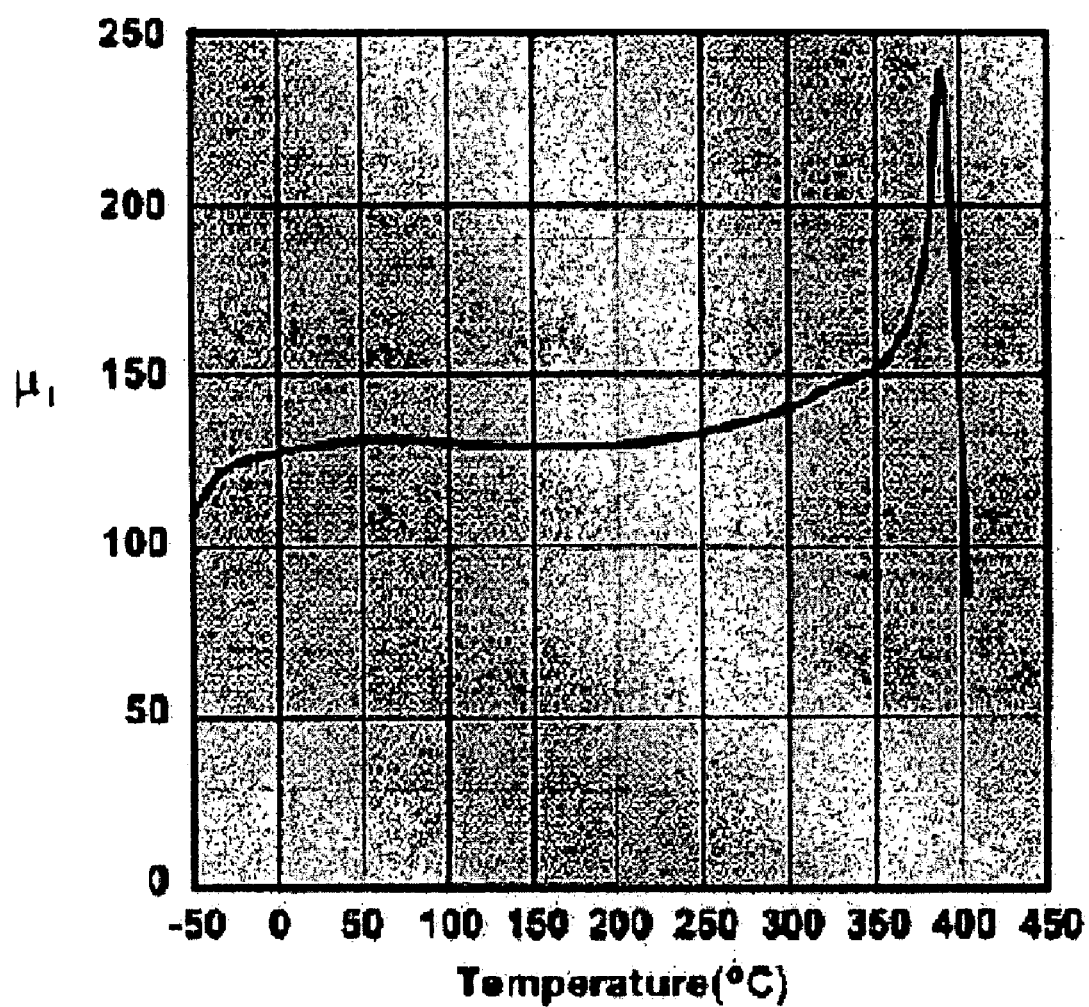
FIG. 13 illustrates the relationship between the initial permeability and the temperature for the NiZn ferrite—Type 61 ferromagnetic material.
Figure 14:
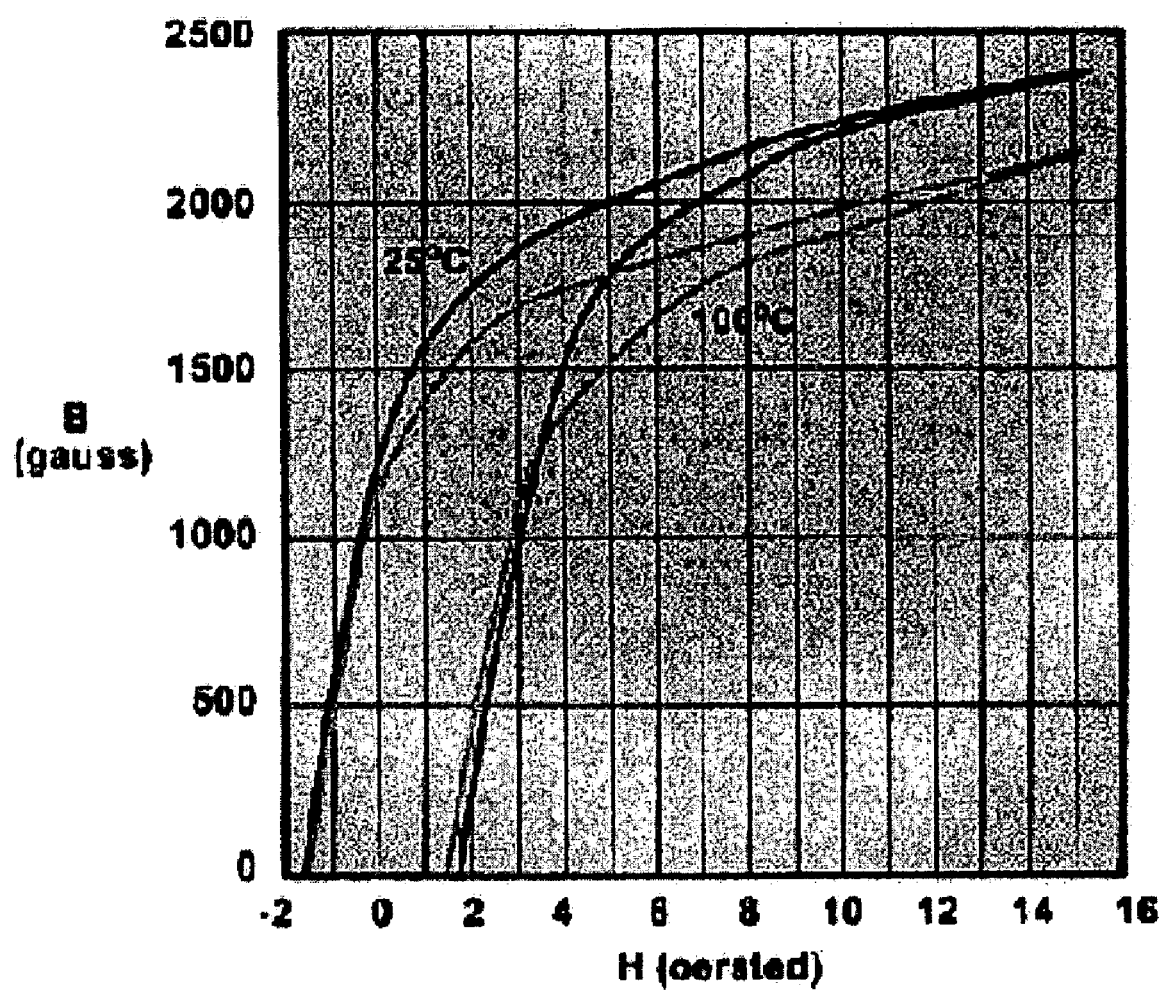
FIG. 14 illustrates a portion of the hysteresis loop displayed as flux density vs. field strength for the NiZn ferrite—Type 61 ferromagnetic material.

FIGS. 11–14 illustrate various characteristics of the Type 61 material, e.g., complex permeability vs. frequency (FIG. 11), percent of original impedance vs. temperature (FIG. 12), initial permeability vs. temperature (FIG. 13) and a portion of the hysteresis loop as flux density vs. field strength (FIG. 14). The Type 61 material has an initial permeability of approximately 130; the temperature coefficient of the initial permeability (20–70° C.) is 0.1%/° C. The material has a flux density of 2350 Gauss at a field strength of 15 Oersted. The residual flux density of the Type 61 material is 1200 Gauss. The loss factor is $30 \times 10^{-6}$ at 1.0 Mega-Hertz.

Although the power loss characteristic is not plotted versus either the magnetic flux density or the frequency, it should be understood that this power loss causes loss of efficiency and the magnetic core of the variable inductive element to heat up during operation. If the core temperature exceeds the Curie temperature, all magnetic/ferrite properties are lost. Thus, the Curie temperature for the particular material used to implement the magnetic core of the inductive element less, perhaps, a safety margin, is the maximum operating temperature of that inductive element. FIG. 13 illustrates the initial permeability vs. temperature for the Type 61 material, which clearly shows what happens if the material heats beyond the Curie temperature of 350° C. (for a frequency of 100 kHz).

Figure 15:
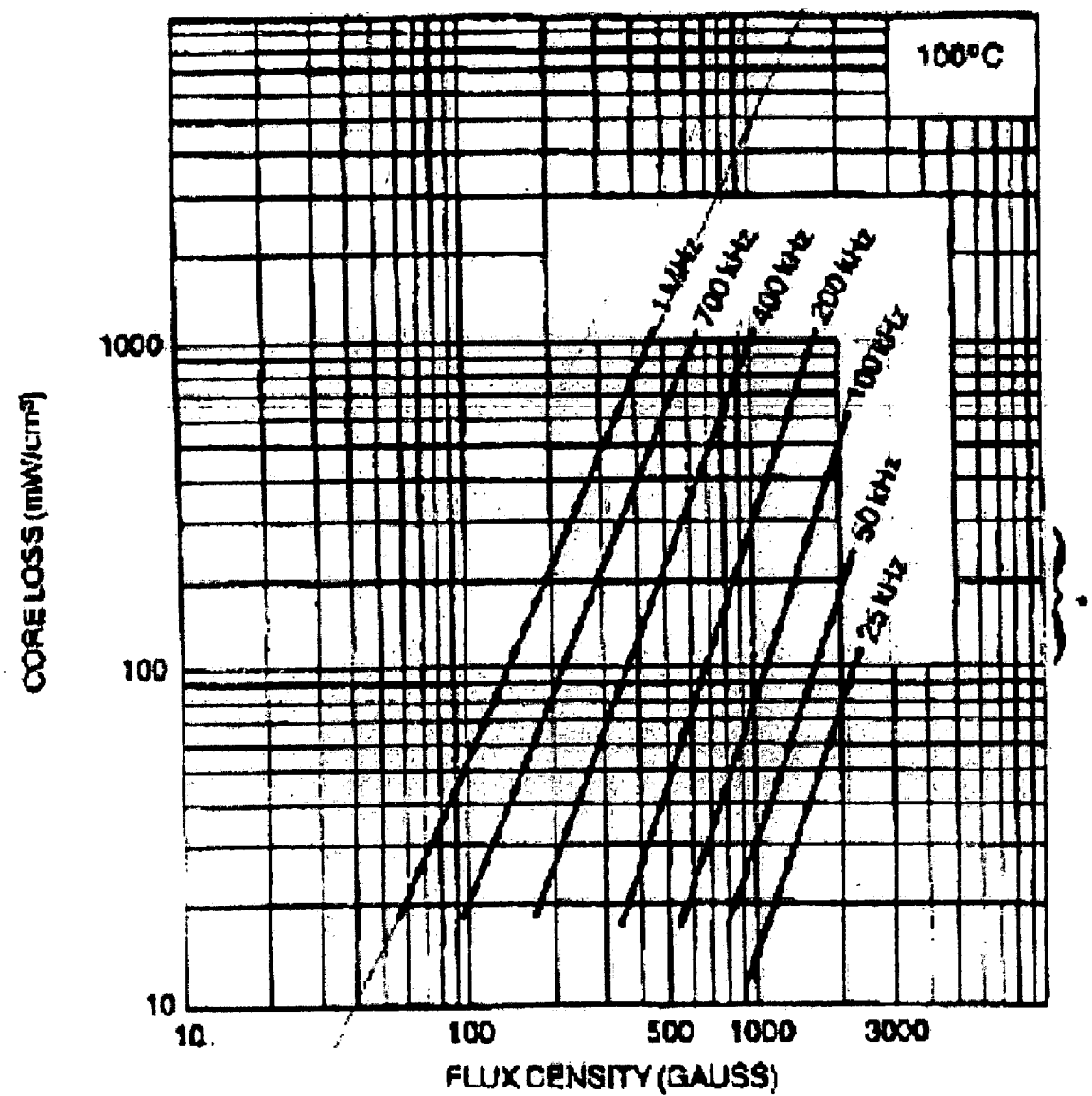
FIG. 15 illustrates power loss vs. flux density and frequency for a ferromagnetic material 3C85.

FIG. 15 illustrates power loss vs. flux density and frequency for another ferromagnetic material, 3C85 (available from Dexter Magnetics of Cerritos, Calif.). It should be understood that all other materials, including high temperature ferrite materials such as Type 61, behave in much the same way as that illustrated for 3C85 in FIG. 15; that is, the actual power loss characteristic may be shifted left and right depending on the quality of the ferromagnetic material. Thus, it should be understood that high temperature ferrite materials such as the Type 61 material would have a graphical relationship between the power loss and the flux density and frequency, which would be similar to 3C85.

However, the distinguishing element is the ability of the high temperature ferrite material to withstand high temperatures, which allows it to be used in high power applications without the inductor core having to be "unreasonably" large and/or needing fancy cooling techniques (e.g., liquid flow, immersion, etc.). For example, if one were to use a low-temperature ferrite (e.g., one having a Curie temperature less than 160° C.), then the core would need to be made of a very large cross section to bring down the flux density (horizontal axis in FIG. 15), to, in turn, reduce power loss (vertical axis in FIG. 15), for a fixed RF frequency. Keeping the power loss low allows the core to operate below its Curie temperature without elaborate cooling systems. However, a large core may be impractical to use, because the entire match network would need to be much larger, possibly too large to install, for example, underneath an electrostatic chuck, which is where it typically is located.

Use of a high temperature ferrite material allows a higher operating temperature so the core may be of smaller cross section and size, operated at a higher flux density, and a system is possible with simple air-cooling, for use at RF powers encountered in plasma processing tools.

Although the NiZn ferrite—Type 61 material has a Curie temperature of greater than 350° C., making it particularly useful for the magnetic core, other magnetic core materials may be used provided they have a sufficiently high Curie temperature for the particular application in which the matching network is utilized.

Alternatively, materials with lower Curie temperatures may be used to implement the magnetic core provided that additional cooling mechanisms, such as special magnetic core configuration (discussed in detail below) or cooling fans (discussed in detail below) are used as well, or a large cross section inductor core is used, to reduce the core flux density. However, the use of large cross section inductor cores may result in quite bulky inductors and the match network simply may not fit under a typical chuck pedestal.

Therefore, in accordance with at least one embodiment of the present invention, an air-cooling system can be employed to stabilize the temperature of the ferrite cores and reduce their operating temperature. As illustrated in FIG. 2, two fan assemblies 215 may be included in the matching network assembly. FIG. 2 shows the fan inlet ports for these assemblies because the fans units used in the fan assemblies are located outside the housing 205, underneath the housing floor. These fan units operate to circulate air through the two right hand compartments of the housing to cool the cores used in the variable inductive elements 140 and 145. This air circulation may serve to cool the magnetic cores used in the variable inductive elements to maintain the material of the magnetic cores within a range of permeability that effectively and stably provides requisite inductive characteristics.

As long as the ferrite material temperature is maintained such that the permeability does not change significantly from that at room temperature, the inductors' inductance will not change significantly. For example, as illustrated in FIG. 13, the range of temperatures from 0° C. to 250° C., and as high as 300° C. is sufficient from purely the standpoint of preventing inductance drift. Furthermore, because the inductors are variable to begin with, inductance drifting due to temperature increase may be compensated for. As the inductances drift, a user, or an automatic match network controller may detect a slight mismatch of the plasma and match network output impedances, and may adjust the inductors to re-establish an impedance match condition.

Nevertheless, there may be other reasons to not allow core temperatures to soar to 250–300° C., e.g., potential polymer conductor insulation failure due to heat radiation from a hot ferrite core in the vicinity. Therefore, it may be particularly useful to maintain the inductor core temperature between 150° C. to 200° C. to maintain inductance and reliability.

The housing 205 may also include a compartment partition 220 that separates the two variable inductive elements 140 and 145. This compartment partition may be made of, for example, the same material of the housing 205, e.g., some type of metal or other material. Alternatively the compartment partition 220 may be made of some type of metallic mesh material. The compartment partition 220 may also serve to provide direction to the air circulated within each of the compartments as a result of the operation of the fan assemblies.

Additionally, in accordance with any of the embodiments of the invention, the compartment partition 220 may be included in the housing 205, and the material used to construct the compartment partition 220 may be selected to provide electromagnetic shield capabilities to shield the electric and magnetic fields generated by the circuits from interacting with one another.

Figure 16:
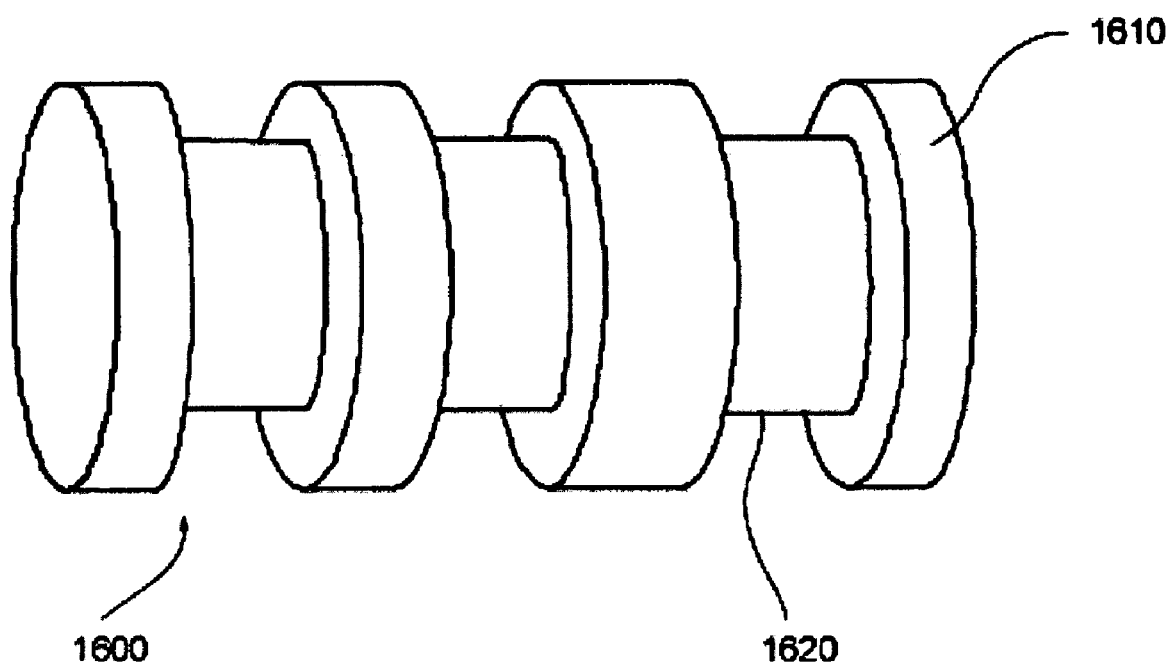
FIG. 16 illustrates an example of a magnetic core configuration used in a variable inductive element in accordance with at least one embodiment of the invention.

In accordance with at least one embodiment of the present invention, longitudinal and/or lateral grooves may be included in the magnetic core included in the variable inductive elements to further improve the cooling efficiency of the ferrite cores by increasing the surface area for exchanging heat with the surrounding air, and for radiative heat exchange with the surroundings. Increasing the area increases both convection (for air moved by fans) and radiation heat transfer (if there is no fan, and the core temperature is high during operation). For example, FIG. 16 provides an enlarged schematic of the magnetic core used in the variable inductive elements shown in FIG. 2. As shown in FIG. 16, the magnetic core 1600 may include latitudinal sections 1610 having a first outer diameter and latitudinal sections 1620 having a second outer diameter that is smaller than the first outer diameter. The magnetic core 1600 may be constructed, for example, using alternating small and large outer diameter ferrite rings or using a ferrite core with latitudinal grooves cast and sintered in one piece.

Figure 17:
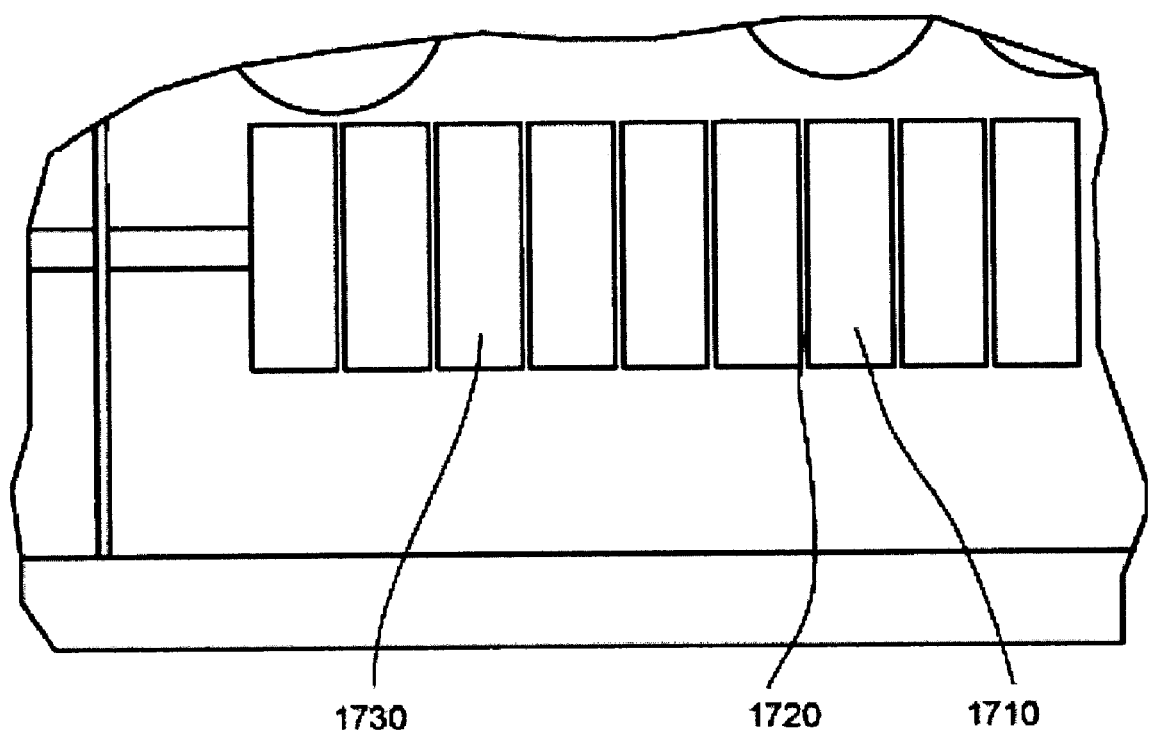
FIG. 17 illustrates another example of a magnetic core configuration used in a variable inductive element in accordance with at least one embodiment of the invention.

FIG. 17 illustrates an example of a magnetic core constructed from a plurality of ferrite rings 1710 slipped on an insulating rod (alumina) 1720, and kept spaced from one another using Kapton tape 1730 (e.g. high temp. tolerant tape) which can be seen as the dark line running longitudinally. The magnetic core may be implemented using such a construction, or the construction illustrated in FIG. 16.

Figure 18:
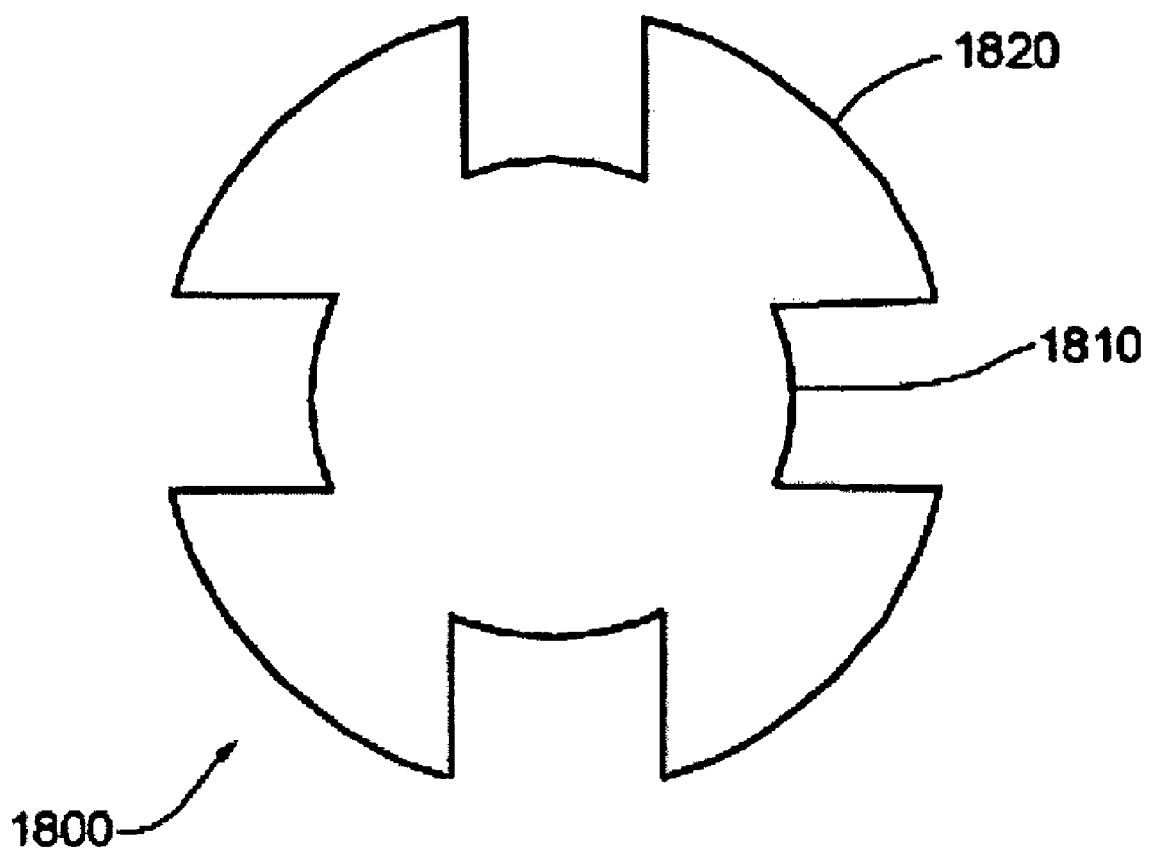
FIG. 18 illustrates yet another example of a magnetic core configuration used in a variable inductive element in accordance with at least one embodiment of the invention.

The magnetic core may also be configured to provide longitudinal sections that differ from one another by the extent that they span from the longitudinal center of the magnetic core. For example, a cross section view of a magnetic core 1800 shown in FIG. 18 illustrates that the magnetic core 1800 may include longitudinal sections 1810 having a first outer diameter and longitudinal sections 1820 having a second outer diameter that is larger than the first outer diameter. It should also be appreciated that there may be more than two different outer diameters, whether they be for latitudinal or longitudinal sections. Thus, the magnetic core may have sections having more than two different outer diameters.

When using the magnetic core constructed as illustrated in FIG. 18, an efficient fan location would be in the "right" end of the housing (in FIG. 2), directing air along the core grooves. One could then vent the air through lateral openings in the side walls, or top and bottom wall.

The various embodiments of the invention may provide increased utility in that they may provide low cost matching networks. Additionally, a matching network designed in accordance with at least one embodiment of the invention may be implemented at a reduced size from that conventionally provided because the variable inductive elements utilized by the embodiments of the present inventions may be significantly smaller in size than conventionally used variable capacitive elements.

While the present invention has been described with reference to specific embodiments, it is not confined to the specific details set forth, but is intended to cover such modifications or changes as may come within the scope of this invention.

What is claimed is:

1. A high power, radio frequency matching network for a plasma processing system, the matching network comprising:
   a match network component including one or more variable inductive elements including a magnetic core, a helical coil, and an actuator configured to physically translate the magnetic core through the helical coil; and
   one or more fixed capacitors, and only fixed capacitors, operatively coupled to the inductive elements, wherein a surface area of the magnetic core includes at least one of longitudinal and latitudinal grooves facilitating cooling of the magnetic core.

2. The matching network of claim 1, wherein the plasma processing system is a magnetically enhanced capacitively-coupled plasma reactor.

3. The matching network of claim 1, wherein the plasma processing system is a two-frequency capacitively coupled plasma reactor.

4. The matching network of claim 1, wherein the plasma processing system is a capacitively coupled plasma reactor.

5. The matching network of claim 1, wherein the plasma processing system is an inductively coupled plasma reactor.

6. The matching network of claim 1, wherein the plasma processing system is a transformer coupled plasma reactor.

7. The matching network of claim 1, wherein the plasma processing system is an electron cyclotron resonance plasma reactor.

8. The matching network of claim 1, wherein the plasma processing system is a Helicon plasma reactor.

9. The matching network of claim 1, wherein the matching network is configured to deliver a maximum radio frequency power of 500 watts.

10. The matching network of claim 1, wherein the matching network is configured to deliver a maximum radio frequency power of 1500 watts.

11. The matching network of claim 1, wherein the matching network is configured to deliver a maximum radio frequency power of 2500 watts.

12. The matching network of claim 1, wherein the matching network is configured to deliver a maximum radio frequency power of 3500 watts.

13. The matching network of claim 1, wherein the matching network is configured to deliver a maximum radio frequency power of 4500 watts.

14. The matching network of claim 1, wherein the matching network is configured to deliver a maximum radio frequency power of 5000 watts.

15. The matching network of claim 1, wherein the temperature factor of permeability for the one or more variable inductive elements is within the range of $-1 \times 10^{-6}$ to $40 \times 10^{-6}$.

16. The matching network of claim 1, wherein the magnetic core of the one or more variable inductive elements has a Curie temperature greater than 150° C.

17. The matching network of claim 1, wherein the magnetic core of the one or more variable inductive elements has a Curie temperature greater than 200° C.

18. The matching network of claim 1, wherein the magnetic core of the one or more variable inductive elements has a Curie temperature greater than 250° C.

19. The matching network of claim 1, wherein the magnetic core of the one or more variable inductive elements has a Curie temperature greater than 300° C.

20. The matching network of claim 1, wherein the magnetic core of the one or more variable inductive elements has a Curie temperature greater than 350° C.

21. The matching network of claim 1, wherein the magnetic core of the one or more variable inductive elements has a Curie temperature greater than 400° C.

22. The matching network of claim 1, wherein the match network component is configured in a L circuit topology.

23. The matching network of claim 1, wherein the match network component is configured in a T circuit topology.

24. The matching network of claim 1, wherein the match network component is configured in a Pi circuit topology.

25. The matching network of claim 1, wherein the match network component includes a filter component.

26. The matching network of claim 1, wherein the magnetic core is made of NiZn ferrite—Type 61.

27. The matching network of claim 1, wherein the match network component further comprises at least one reactive element and at least one capacitive element coupled to the one or more variable inductive elements.

28. The matching network of claim 27, wherein the match network component further comprises at least one additional inductive element.

29. The matching network of claim 1, wherein the magnetic core of the one or more inductive elements is the only movable element of the variable inductive elements and any radio frequency current-carrying coils included in the impedance matching network are stationary.

30. The matching network of claim 1, wherein moving the magnetic core in and out of the helical coil changes the variable inductive element's inductance.

31. A plasma processing system comprising:
a high power, radio frequency matching network including a match network component including one or more variable inductive elements including a magnetic core, a helical coil, and an actuator configured to physically translate the magnetic core through the helical coil; and
one or more fixed capacitors, and only fixed capacitors, operatively coupled to the inductive elements,
wherein a surface area of the magnetic core includes at least one of longitudinal and latitudinal grooves facilitating cooling of the magnetic core.

32. The plasma processing system of claim 31, wherein the further comprising a filter component located between an RF source of the system and the match network component.

33. The plasma processing system of claim 31, further comprising a filter component located between a plasma load of the system and the match network component.

34. The plasma processing system of claim 31, further comprising an inductively coupled plasma source.

35. The plasma processing system of claim 31, further comprising a transformer coupled plasma source.

36. The plasma processing system of claim 31, further comprising a Helicon plasma source.

37. The plasma processing system of claim 31, further comprising an electron cyclotron resonance plasma source.

38. The plasma processing system of claim 31, further comprising a capacitively coupled plasma source.

39. The plasma processing system of claim 31, further comprising a two-frequency capacitively coupled plasma source.

40. The plasma processing system of claim 31, further comprising a magnetically enhanced capacitively coupled plasma source.

41. The plasma processing system of claim 31, wherein the at least one of the one or more variable inductive elements is also an integral part of the radio frequency power source used by the plasma processing system.

42. The plasma processing system of claim 31, further comprising a filter component including inductive elements and capacitive elements configured to filter a signal input into the matching network and wherein the match network component includes capacitive elements coupled to the at least one variable inductive element to provide impedance matching.

43. The plasma processing system of claim 31, further comprising a fan assembly including a fan unit configured to circulate air around the magnetic core of the variable inductive element to provide cooling of the magnetic core.

44. A high power, radio frequency matching network assembly for a plasma processing system, the matching network assembly comprising:
- a plurality of variable inductive elements each including a magnetic core, a helical coil, and an actuator configured to physically translate the magnetic core through the helical coil;
- one or more fixed capacitors, and only fixed capacitors, operatively coupled to the inductive elements; and
- a housing including the plurality of variable inductive elements, the housing including a housing compartment partition that shields each of the variable inductive elements from fields generated by the other of the variable inductive elements,
- wherein a surface area of the magnetic core includes at least one of longitudinal and latitudinal grooves facilitating cooling of the magnetic core.

45. The matching network assembly of claim 44, wherein the matching network is configured to deliver a maximum radio frequency power of 500 watts.

46. The matching network assembly of claim 44, wherein the matching network is configured to deliver a maximum radio frequency power of 1500 watts.

47. The matching network assembly of claim 44, wherein the matching network is configured to deliver a maximum radio frequency power of 2500 watts.

48. The matching network assembly of claim 44, wherein the matching network is configured to deliver a maximum radio frequency power of 3500 watts.

49. The matching network assembly of claim 44, wherein the matching network is configured to deliver a maximum radio frequency power of 4500 watts.

50. The matching network assembly of claim 44, wherein the matching network is configured to deliver a maximum radio frequency power of 5000 watts.

51. The matching network assembly of claim 44, wherein a temperature factor of permeability for one or the plurality of variable inductive elements is within the range of $-1 \times 10^{-6}$ to $40 \times 10^{-6}$.

52. The matching network assembly of claim 44, wherein the magnetic core of at least one of the plurality of variable inductive elements has a Curie temperature greater than 150° C.

53. The matching network assembly of claim 44, wherein the magnetic core of at least one of the plurality of variable inductive elements has a Curie temperature greater than 200° C.

54. The matching network assembly of claim 44, wherein the magnetic core of at least one of the plurality of variable inductive elements has a Curie temperature greater than 250° C.

55. The matching network assembly of claim 44 wherein the magnetic core of at least one of the plurality of variable inductive elements has a Curie temperature greater than 300° C.

56. The matching network assembly of claim 44, wherein the magnetic core of at least one of the plurality of variable inductive elements has a Curie temperature greater than 350° C.

57. The matching network assembly of claim 44, wherein the magnetic core of at least one of the plurality of variable inductive elements has a Curie temperature greater than 400° C.

58. The matching network assembly of claim 44, wherein the match network component is configured in a L circuit topology.

59. The matching network assembly of claim 44, wherein the match network component is configured in a T circuit topology.

60. The matching network assembly of claim 44, wherein the match network component is configured in a Pi circuit topology.

61. The matching network assembly of claim 44, wherein the match network component includes a filter component.

62. The matching network assembly of claim 44, further comprising a filter component located between an RF source of the system and the match network component.

63. The matching network assembly of claim 44, further comprising a filter component located between the a plasma load of the system and the match network component.

64. The matching network assembly of claim 44, wherein the magnetic cores are made of NiZn ferrite—Type 61.

65. The matching network assembly of claim 44, further comprising at least one reactive element and at least one capacitive element coupled to the plurality of variable inductive elements.

66. The matching network assembly of claim 44, further comprising at least one additional inductive element.

67. The matching network assembly of claim 66, further comprising inductive elements and capacitive elements configured to filter a signal input into the matching network assembly and capacitive elements coupled to the plurality of variable inductive elements to provide impedance matching.

68. The matching network assembly of claim 44, further comprising a plurality of fan assemblies each including a fan unit configured to circulate air around the magnetic core of one of the variable inductive elements to provide cooling of the magnetic core of the respective variable inductive element.

69. The matching network assembly of claim 44, wherein a surface area of each of the magnetic cores includes at least one of longitudinal and latitudinal grooves facilitating cooling of the magnetic core.

70. The matching network assembly of claim 44, wherein the magnetic cores of the inductive elements are the only movable elements of the variable inductive elements and any radio frequency current-carrying coils included in the impedance matching network are stationary.

71. The matching network assembly of claim 44, wherein moving the magnetic core of each of the variable inductive elements in and out of the helical coil included in each of the variable inductive elements changes the variable inductive element's inductance.

* * * * *